(12) United States Patent
Ishikawa et al.

(10) Patent No.: US 6,285,269 B1
(45) Date of Patent: *Sep. 4, 2001

(54) HIGH-FREQUENCY SEMICONDUCTOR DEVICE HAVING MICROWAVE TRANSMISSION LINE BEING FORMED BY A GATE ELECTRODE SOURCE ELECTRODE AND A DIELECTRIC LAYER IN BETWEEN

(75) Inventors: Yohei Ishikawa, Kyoto; Koichi Sakamoto, Otsu; Sadao Yamashita, Kyoto; Takehisa Kajikawa, Osaka, all of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/891,143

(22) Filed: Jul. 10, 1997

(30) Foreign Application Priority Data

Jul. 10, 1996 (JP) .................................................... 8-201210

(51) Int. Cl.⁷ .............................. H01P 3/18; H01L 29/812

(52) U.S. Cl. .......................... 333/247; 333/246; 257/275; 257/276; 257/664

(58) Field of Search .................................. 257/275, 276, 257/401, 664, 259; 333/247, 246

(56) References Cited

U.S. PATENT DOCUMENTS

| 4,298,879 | * | 11/1981 | Hirano ................................. 257/275 |
| 4,376,287 | * | 3/1983 | Sechi .................................... 333/247 |
| 4,953,001 | * | 8/1990 | Kaiser, Jr. et al. ................... 333/247 |
| 5,023,624 | * | 6/1991 | Heckaman et al. .................. 343/860 |
| 5,206,712 | * | 4/1993 | Kornumpf et al. ................... 361/393 |
| 5,355,102 | * | 10/1994 | Kornumpf et al. ................... 333/247 |
| 5,483,092 | * | 1/1996 | Kosaki .................................. 257/276 |
| 5,510,758 | * | 4/1996 | Fujita et al. .......................... 333/247 |
| 5,525,819 | * | 6/1996 | Yarbrough ............................ 257/275 |
| 5,559,363 | * | 9/1996 | Immorlica, Jr. ...................... 257/664 |
| 6,100,554 | * | 8/2000 | Ishikawa et al. .................... 257/275 |

FOREIGN PATENT DOCUMENTS 0817275   1/1998  (EP) .

OTHER PUBLICATIONS

JP 58 060575 A (English translation), Apr. 1983.*

Patent Asbtracts of Japan, vol. 007, No. 148, Jun. 29, 1983 & JP 58 060575 a (NEC Corp), Apr. 11, 1983.

Patent Abstracts of Japan, vol. 011, No. 329, Oct. 27, 1987 & JP 62 115783 a (Mitsubishi Electric Corp), May 27, 1987.

* cited by examiner

*Primary Examiner*—Eddie Lee
*Assistant Examiner*—Bradley William Baumeister
(74) *Attorney, Agent, or Firm*—Ostrolenk, Faber, Gerb & Soffen, LLP

(57) ABSTRACT

A drain electrode and a source electrode are provided for an intrinsic device section on a GaAs substrate with a gate electrode placed therebetween. Almost all or substantial parts of the GaAs substrate is covered by an extending source electrode extending from the source electrode. A belt-shaped extending drain electrode is provided on the extending source electrode with a dielectric layer placed therebetween, and thereby an output-side microstripline is formed. A belt-shaped extending gate electrode is also provided on the extending source electrode with a dielectric layer placed therebetween, and thereby an input-side microstripline is formed.

18 Claims, 8 Drawing Sheets

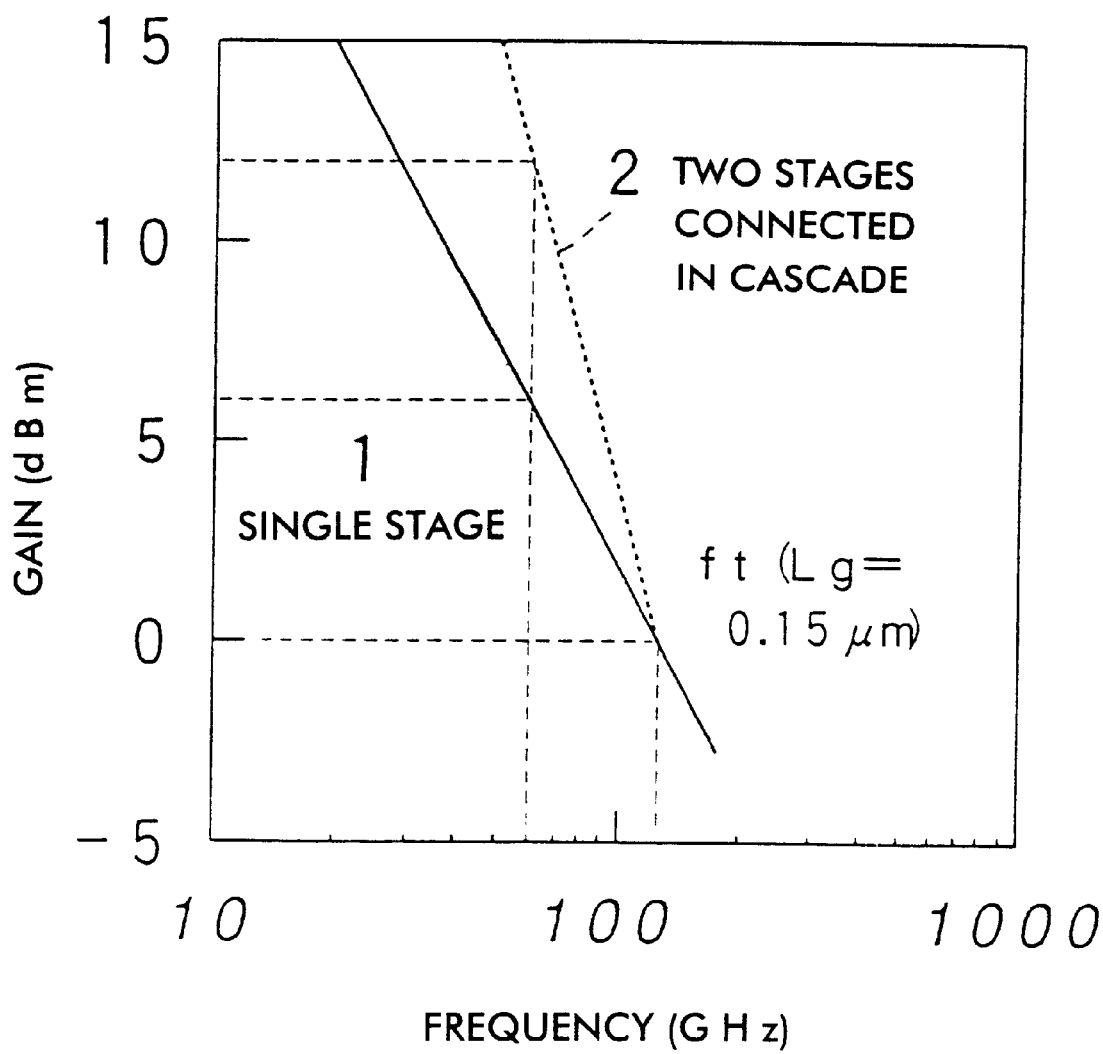

HIGH-FREQUENCY SEMICONDUCTOR DEVICE HAVING MICROWAVE TRANSMISSION LINE BEING FORMED BY A GATE ELECTRODE SOURCE ELECTRODE AND A DIELECTRIC LAYER IN BETWEEN

BACKGROUND OF THE INVENTION

1. Field of the Invention

The present invention relates to high-frequency semiconductor devices. The present invention more particularly relates to a high-frequency field effect transistor (FET) for use in a millimeter-wave or quasi-millimeter-wave circuit module for amplification, oscillation, or modulation.

2. Description of the Related Art

FIG. 1 is a plan view showing a structure of an electrode formed on a semiconductor surface in a currently used conventional high-frequency FET. In this high-frequency FET, three source electrodes 2 extend from a source pad section 1 and two drain electrodes 4 extending from a drain pad section 3 are disposed between the source electrodes 2. Four very narrow gate electrodes 6 extending from two gate pad sections 5 disposed between the tips of the drain electrodes 4 and the source pad section 1 extend the length of areas sandwiched by the source electrodes 2 and the drain electrodes 4. In other words, this high-frequency FET is a horizontal-type (plane-type) FET in which the source electrodes 2, the gate electrodes 6, and the drain electrodes 4 are formed on the same plane.

To make such an FET usable at higher frequencies, it is necessary to reduce the distance between the source electrode and the drain electrode and to narrow the gate electrode (reduce the gate length). A narrow and long gate electrode has large parasitic resistance and parasitic capacitance, however, and thereby the characteristics of the FET deteriorate, including for example a noise increase, an operating-frequency decrease, a gain reduction, and an increased input/output reflection loss.

When the FET is viewed as a waveguide which transmits a microwave, it has a very unusual structure and its operating range is limited to a low frequency zone in which the FET can be approximated to a lumped-constant circuit device.

FIG. 2 is a plan view illustrating an electrode structure of an air-bridge-gate-structure FET which improves upon the above FET of FIG. 1 and has less characteristics deterioration. In this structure, a source electrode 8 disposed between source pad sections 7 on a semiconductor surface faces a drain electrode 9 along its full length. A wide gate electrode 11 extends over the source electrode 8, a gate pad section 10 is disposed at the side of the gate electrode opposite the drain electrode 9 against the source electrode 8, and the distal edge of the gate electrode 11 is Schottky-connected to the semiconductor surface between the source electrode 8 and the drain electrode 9.

Since the gate electrode 11 can be made wide in such an air-bridge-gate-structure FET, the parasitic resistance and the parasitic inductance of the gate electrode 11 are reduced and the RF characteristics (especially noise characteristics) are improved.

At a portion where the gate electrode 11 passes over the source electrode 8, a parasitic capacitor is generated between the source electrode 8 and the gate electrode 11, which decreases the operating frequency. To reduce this parasitic capacitance, the source electrode 8 needs to be narrowed. If the source electrode 8 is narrowed, the source electrode 8 gains additional parasitic resistance and additional parasitic inductance, so only a limited amount of characteristics improvement is available in such a method.

When this air-bridge-gate-structure FET is viewed as a waveguide, it has a very unusual structure, like a horizontal-type FET, and its operating range is limited to a low frequency zone in which the FET can be approximated to a lumped-constant circuit device.

To solve the problem of characteristics deterioration in a high-frequency FET for use in millimeter-wave and quasi-millimeter-wave ranges, it is an important issue to eliminate wiring resistors and parasitic components such as parasitic capacitors and parasitic inductors in the gate electrode and the drain electrode, as described above. It is very difficult, however, to suppress characteristics deterioration in a high-frequency range in a conventional FET structure, and a semiconductor device suited to a millimeter wave and a quasi-millimeter wave has not yet been manufactured.

SUMMARY OF THE INVENTION

The present invention is made in consideration of the above-described drawbacks in a conventional device. The present invention is able to suppress characteristics deterioration of a semiconductor device in a high-frequency range by using the structure of a micro-wave transmission line for electrode structures between the gate electrode and the source electrode and between the drain electrode and the source electrode.

According to one aspect of the invention, a high-frequency semiconductor device has an intrinsic device section formed on part of a semiconductor substrate; a source electrode and a drain electrode are disposed in the intrinsic device section with a gate electrode placed therebetween; a micro-wave transmission line is formed between the gate electrode (or an electrode section electrically connected to the gate electrode) and the source electrode (or an electrode section electrically connected to the source electrode); and a micro-wave transmission line is formed between the drain electrode (or an electrode section electrically connected to the drain electrode) and the source electrode (or an electrode section electrically connected to the source electrode).

In such a high-frequency semiconductor device, since a micro-wave transmission line is formed between the drain electrode or an electrode section electrically connected to the drain electrode and the source electrode or an electrode section electrically connected to the source electrode, and a micro-wave transmission line is formed between the gate electrode or an electrode section electrically connected to the gate electrode and the source electrode or an electrode section electrically connected to the source electrode, parasitic components between the gate and source electrodes and between the drain and source electrodes can be reduced and the characteristics of the high-frequency semiconductor device can be improved.

According to another aspect of the invention, a high-frequency semiconductor device has an intrinsic device section formed on part of a semiconductor substrate; a source electrode and a drain electrode are disposed in the intrinsic device section with a gate electrode placed therebetween; the source electrode (or an electrode section electrically connected to the source electrode) covers most or substantial parts of the semiconductor substrate; a micro-wave transmission line is formed by oppositely disposing the gate electrode or an electrode section electrically connected to the gate electrode through a dielectric layer above the source electrode or an electrode section electrically connected to the source electrode; and a micro-wave transmission line is formed by oppositely disposing the drain electrode or an electrode section electrically connected to the drain electrode through a dielectric layer above the source electrode or an electrode section electrically connected to the source electrode.

Any type of micro-wave transmission line can be used, such as a microstripline, a slot line, and a coplanar line. In the high-frequency semiconductor device described above, the source electrode opposes the drain electrode with the dielectric layer disposed therebetween, or the source electrode opposes the gate electrode with the dielectric layer disposed therebetween to form a micro-wave transmission line similar to a microstripline.

The high-frequency semiconductor devices described above may be configured with a plurality of the intrinsic device sections disposed on the semiconductor substrate and with the plurality of the intrinsic device sections being connected by micro-wave transmission lines.

In such a high-frequency semiconductor device, since a plurality of intrinsic device sections are connected with micro-wave transmission lines, a larger output power is obtained than in a single intrinsic device section.

In a high-frequency semiconductor device according to these aspects of the present invention, since a micro-wave transmission line is used for making connections to the intrinsic device section, an input signal is transferred through the waveguides without disturbing its electromagnetic field distribution. Therefore, drawbacks caused by parasitic inductance or parasitic capacitance in a semiconductor device having a conventional structure can be eliminated. According to the present invention, a low-noise millimeter-wave semiconductor device having a high power gain and high operating frequencies is obtained.

BRIEF DESCRIPTION OF THE DRAWINGS

FIG. 11 is a chart showing the difference in gain between a device having a single-stage intrinsic device section (FET structure) and a device having two-stage intrinsic device sections.

DESCRIPTION OF EMBODIMENTS OF THE INVENTION

First Embodiment

Figure 3:
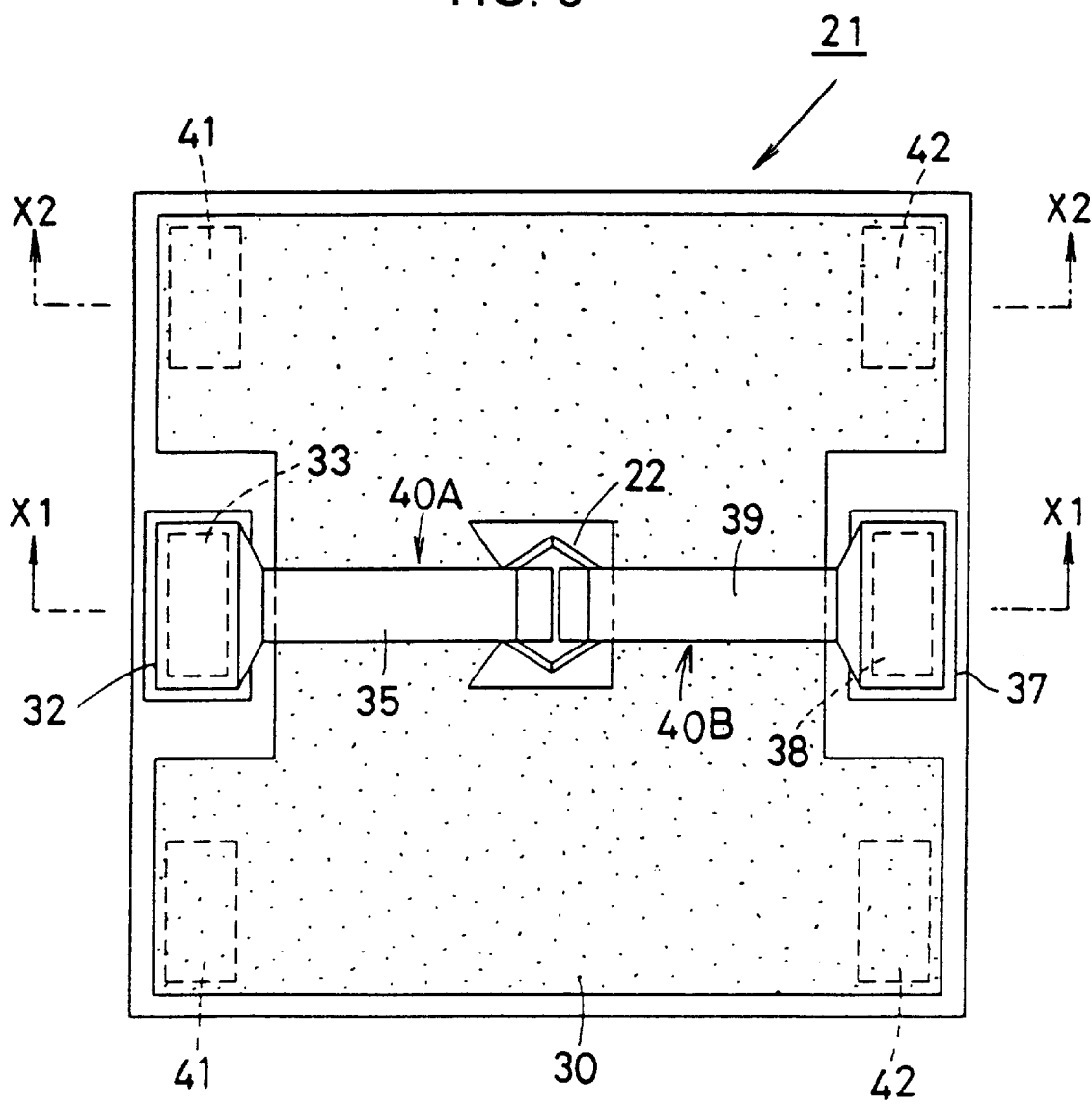
FIG. 3 is a plan view showing a structure of a high-frequency semiconductor device according to a first embodiment of the present invention.
Figure 4:
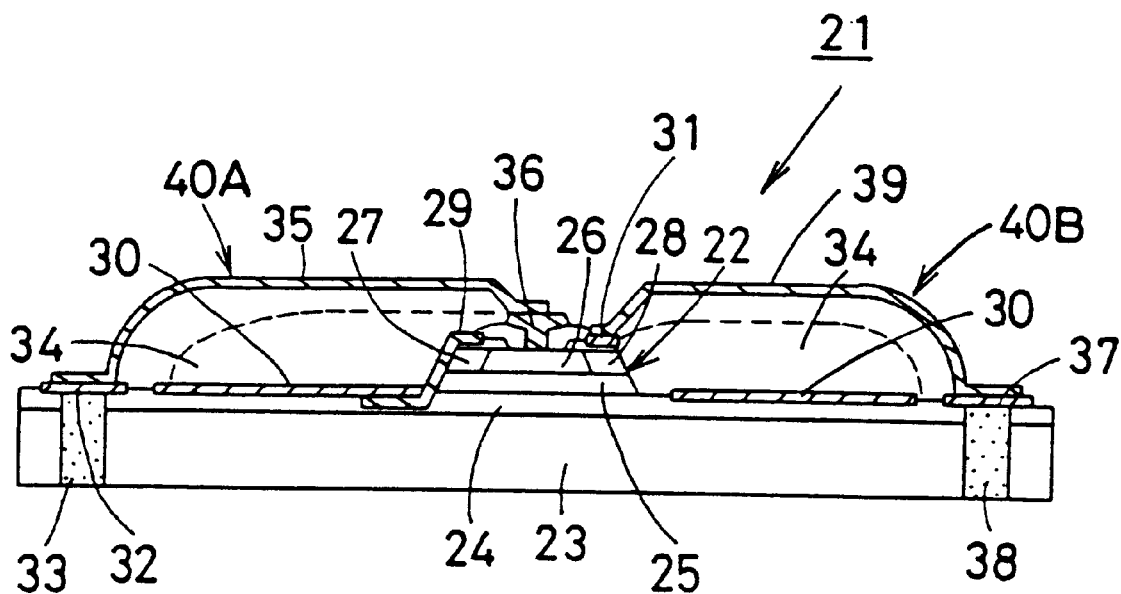
FIG. 4 is a cross section taken on line X1—X1 shown in FIG. 3.
Figure 5:
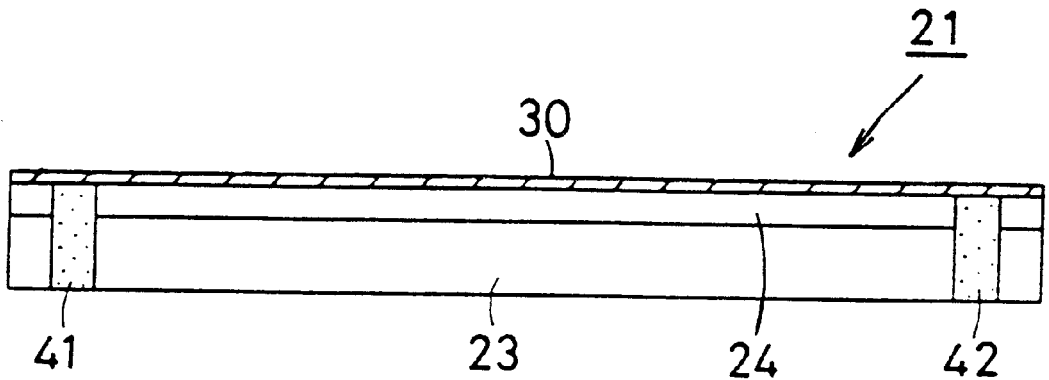
FIG. 5 is a cross section taken on line X2—X2 shown in FIG. 4.
Figure 6:
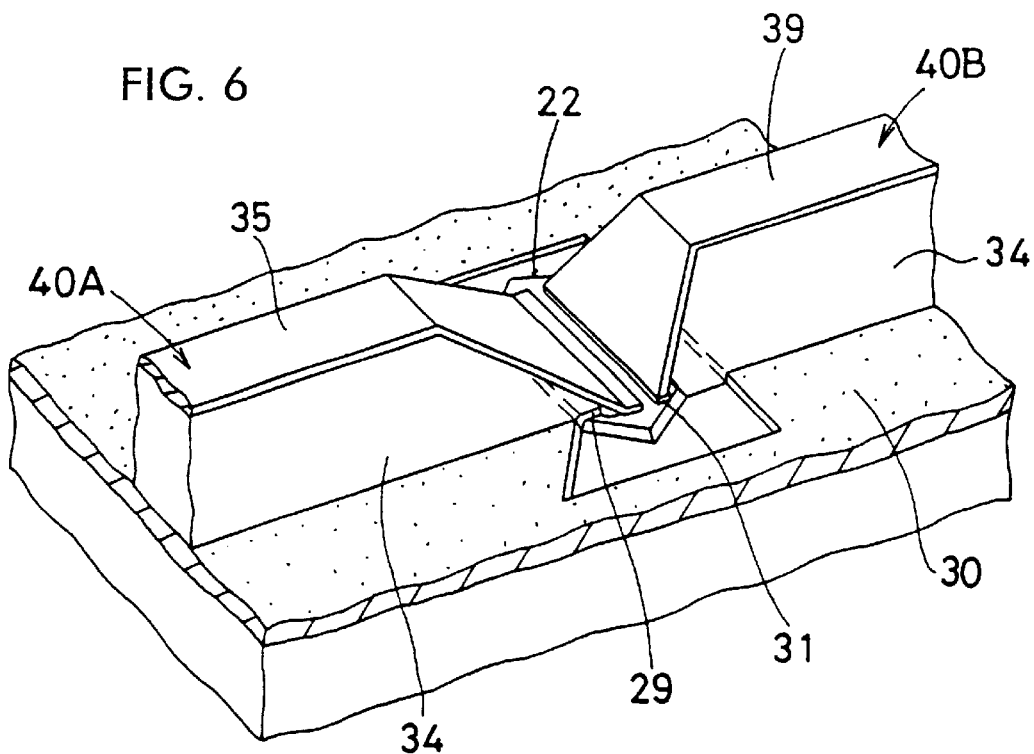
FIG. 6 is a perspective view showing the structure in the vicinity of an intrinsic device section in the semiconductor device of FIG. 3.

FIG. 3 is a plan view showing a structure of a high-frequency semiconductor device (high-frequency FET) 21 according to one embodiment of the present invention. FIG. 4 is a cross section taken on line X1—X1 shown in FIG. 3, and FIG. 5 is a cross section taken on line X2—X2 shown in FIG. 3. FIG. 6 is a perspective view showing the structure in the vicinity of an intrinsic device section 22 of the high-frequency semiconductor device 21.

On a semi-insulating GaAs substrate (GaAs wafer) 23, a buffer layer 24 made from undoped-GaAs, a channel layer (active layer) 25 made from n-InGaAs, and an insulating layer 26 made from undoped-AlGaAs are epitaxially grown by the molecular beam epitaxial (MBE) method, and etched in a hexagonal shape to form a mesa type intrinsic device section 22. The buffer layer 24 covers the surface of the GaAs substrate 23. At both ends of the insulating layer 26, n-type impurities are injected such that they reach the channel layer 25, to form an n-type source area 27 and an n-type drain area 28.

On a sloped portion of the intrinsic device section 22 made from the buffer layer 24, the channel layer 25, and the insulating layer 26, a source electrode 29 formed of an electrode material such as Au/Ge is in ohmic contact with the source area 27. An extending source electrode 30 is formed on almost the entire area of the buffer layer 24 except where the intrinsic device section 22 is formed. The extending source electrode 30 is electrically connected to the source electrode 29 and thereby contacts the source area 27 through the source electrode 29.

A drain electrode 31 ohmically-contacts the drain area 28 in the intrinsic device section 22. The extending source electrode 30 does not cover part of the buffer layer 24 (at the output side) and the buffer layer 24 is exposed there. A drain pad section 37 is formed at that position. Under the drain pad section 37, an electrically conductive via hole 38 is formed. From the intrinsic device section 22 to the drain pad section 37, a belt-shaped dielectric layer 34 about 10 $\mu$m thick and about 25 $\mu$m wide is formed of $SiO_2$, SiN, and PSG. An extending drain electrode 39 is formed in a belt shape on the upper surface of the dielectric layer 34, and is connected respectively to the drain electrode 31 and the drain pad section 37 at its two ends.

On the upper surface of the intrinsic device section 22, a mushroom-shaped gate electrode 36 is formed of an electrode material such as TiN such that it is Schottky-connected to the insulating layer 26. The extending source electrode 30 does not cover another part of the buffer layer 24 (the input side) and the buffer layer 24 is exposed there. A gate pad section 32 is formed at that position. Under the gate pad section 32, an electrically conductive via hole 33 is formed. From the intrinsic device section 22 to the gate pad section 32, a belt-shaped dielectric layer 34 about 10 $\mu$m thick and about 25 $\mu$m wide is formed by $SiO_2$, SiN, and PSG. An extending gate electrode 35 is formed in a belt shape on the upper surface of the dielectric layer 34, and is connected respectively to the gate electrode 36 and the gate pad section 32 at its two ends.

An input-side microstripline 40A is formed by the extending source electrode 30 and the extending gate electrode 35 formed thereabove with the dielectric layer 34 placed therebetween. In the same way, an output-side microstripline 40B is formed by the extending source electrode 30 and the extending drain electrode 39 formed thereabove with the dielectric layer 34 placed therebetween.

Via holes 41 and 42 electrically connected to the extending source electrode 30 are formed at the input and output sides, respectively.

Operation of the Present Embodiment

In the high-frequency semiconductor device 21 manufactured in this way, the intrinsic device section 22 has an FET structure in which the source electrode 29 and the drain electrode 31 are disposed with the gate electrode 36 placed therebetween.

Figure 7:
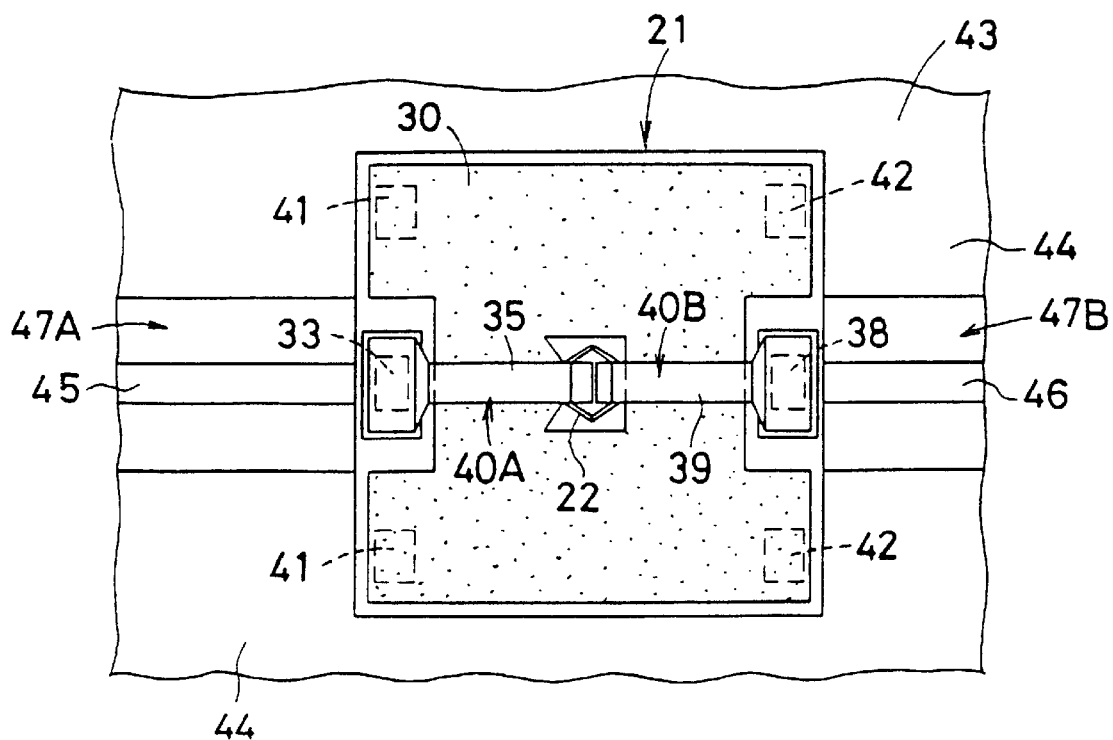
FIG. 7 is a partially broken away plan view showing the semiconductor device of FIG. 3 is mounted on a circuit board.

The high-frequency semiconductor device 21 can be connected to a circuit board 43 having coplanar lines 47A and 47B as shown in FIG. 7. The input-side microstripline 40A of the semiconductor device 21 is connected to the input-side coplanar line 47A of the circuit board 43 by connecting the via holes 41, which are electrically connected to the input-side extending source electrode 30, to a ground conductor 44 of the input-side coplanar line 47A on the circuit board 43, and by connecting the via hole 33, which is electrically connected to the extending gate electrode 35, to the strip conductor 45 of the coplanar line 47A. In the same way, the output-side microstripline 40B of the semiconductor device 21 is connected to the output-side coplanar line 47B of the circuit board 43 by connecting the via holes 42, which are electrically connected to the output-side extending source electrode 30, to the ground conductor 44 of the output-side coplanar line 47B on the circuit board 43 and by connecting the via hole 38, which is electrically connected to the extending drain electrode 39, to the strip conductor 46 of the coplanar line 47B.

Therefore, at the input side of the semiconductor device 21, among the electrodes constituting the microstripline 40A and sandwiching the dielectric layer 34, the extending source electrode 30 serves as an RF-ground electrode and the extending gate electrode 35 serves as an RF signal line. In the same way at the output side, among the electrodes constituting the microstripline 40B and sandwiching the dielectric layer 34, the extending source electrode 30 serves as an RF-ground electrode and the extending drain electrode 39 serves as an RF signal line.

As described above, by inputting/outputting a signal from the lower surface of the GaAs substrate 23 through the via holes 33, 41, 38, and 42, noise and signal leakage caused by parasitic coupling between the coplanar lines 47A and 47B of the circuit board 43 and the microstriplines 40A and 40B of the high-frequency semiconductor device 21 are reduced.

The characteristic impedance of the input and output microstriplines 40A and 40B matches that of the intrinsic device section 22. In other words, the line width and the line height (namely, the widths of the extending gate electrode 35 and the extending drain electrode 39 and the thickness of the dielectric layer 34) of the input and output microstriplines 40A and 40B are designed such that the characteristic impedance is substantially equal to the input and output impedance of the intrinsic device section 22 in the millimeter wave band and the matching conditions are satisfied. When the microstriplines 40A and 40B are 10 μm thick and 25 μm wide and are formed by use of a dielectric layer 34 having a relative dielectric constant $\in$ of 2.5 to 5.0, for example, a characteristic impedance of 40 to 70 Ω is obtained. This characteristic impedance is substantially equal to the input and output impedance of an intrinsic device section 22 having a gate width of 30 to 60 μm in the millimeter wave band, and the matching conditions are satisfied.

An RF signal (electromagnetic wave) input to the input-side microstripline 40A through the via holes 33 and 41 from the coplanar line 47A of the circuit board 43 is transferred through the microstripline 40A to reach the intrinsic device section 22. Then the RF signal to which signal processing such as amplification has been applied in the intrinsic device section 22 is transferred through the microstripline 40B, and sent to the coplanar line 47B of the circuit board 43 through the via holes 38 and 42.

Features of the Present Embodiment

Figure 1:
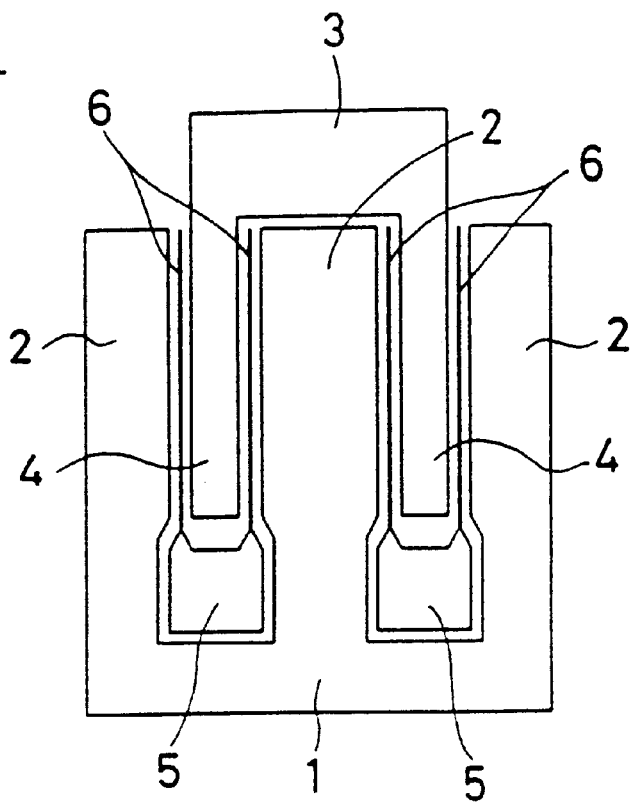
FIG. 1 is a plan view showing an electrode structure in a conventional horizontal-type FET.
Figure 2:
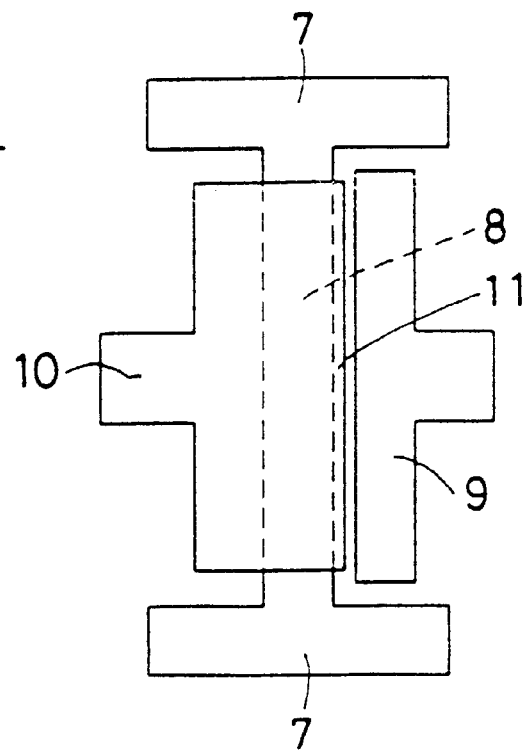
FIG. 2 is a plan view showing an electrode structure in a conventional FET having an air bridge gate structure.

In general, a method for improving the performance of a high-frequency semiconductor device such as the high-frequency semiconductor device 21 is to reduce coupling of electromagnetic fields between the extending gate electrode 35 and the extending source electrode 30 and between the extending gate electrode 35 and the extending drain electrode 39. In a conventional horizontal-type FET, electrodes are formed such that they do not intersect (see FIG. 1), or electrodes are formed such that the intersections of electrodes become as small as possible (see FIG. 2). In contrast, in the high-frequency semiconductor device 21 according to the first embodiment of the present invention, by active use of coupling between the extending gate electrode 35 and the extending source electrode 30, and between the extending drain electrode 39 and the extending source electrode 30, these input and output electrodes are made using microstrip-conductor-type waveguide structures to reduce parasitic coupling components (parasitic inductance and parasitic capacitance) of the extending gate electrode 35 and the extending drain electrode 39. In other words, substantially no parasitic coupling exists between the upper and lower electrodes so an RF signal transfers in phase through the input and output microstriplines 40A and 40B between the upper and lower electrodes.

Second Embodiment

Figure 8A:
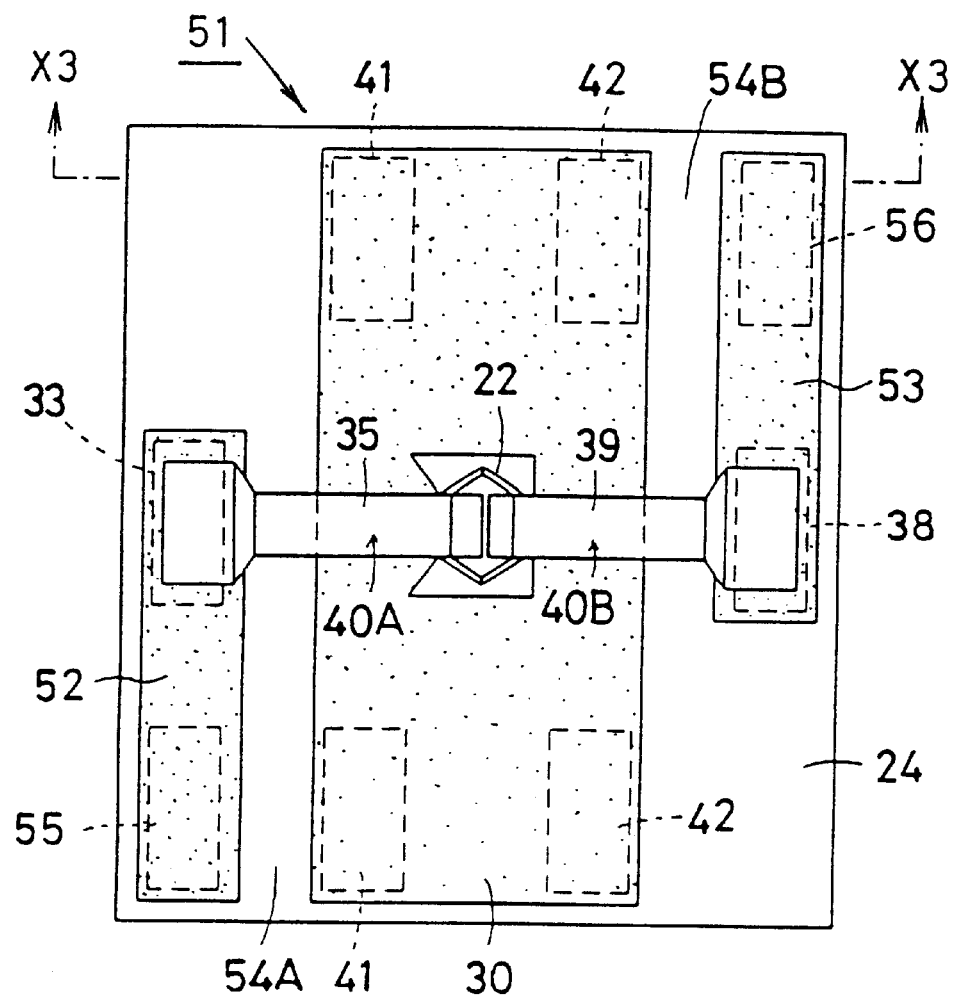
FIG. 8A is a plan view showing a structure of a high-frequency semiconductor device according to a second embodiment of the present invention.
Figure 8B:
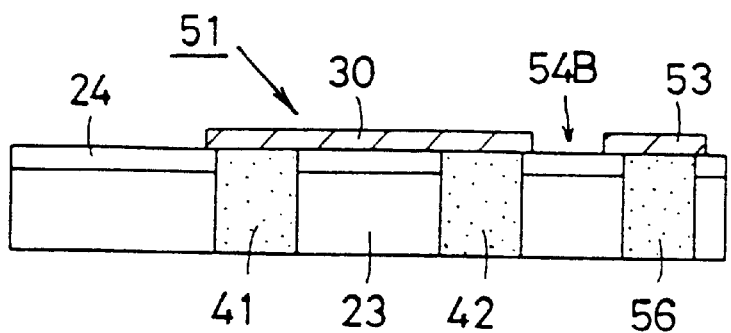
FIG. 8B is a cross section taken on line X3—X3 shown in FIG. 8A.

FIG. 8A is a plan view of a high-frequency semiconductor device 51 according to a second embodiment of the present invention. FIG. 8B is a cross section taken on line X3—X3 shown in FIG. 8A. In this high-frequency semiconductor device 51, a ground conductor 52 is provided in parallel to an input-side edge of an extending source electrode 30 to form an input-side slot line 54A between the edge of the extending source electrode 30 and the ground conductor 52. The input-side slot line 54A is connected to an input-side microstripline 40A at a right angle so that the slot line 54A and the microstripline 40A are electromagnetically coupled. In the same way, a ground conductor 53 is provided in parallel to an output-side edge of the extending source electrode 30 to form an output-side slot line 54B between the edge of the extending source electrode 30 and the ground conductor 53. The output-side slot line 54B is connected to an output-side microstripline 40B at a right angle so that the slot line 54B and the microstripline 40B are electromagnetically coupled. Via holes 55 and 56 are electrically connected to the ground conductors 52 and 53, respectively.

An RF signal input to the slot line 54A is transmitted to the intrinsic device section 22 through the microstripline 40A. An RF signal output from the intrinsic device section 22 passes through the microstripline 40B and is output from the slot line 54B.

Since the slot lines 54A and 54B can be connected to slot lines on a circuit board through via holes 41 and 55, and 42 and 56, respectively, the device is easily connected to the circuit board formed by slot lines.

Third Embodiment

Figure 9:
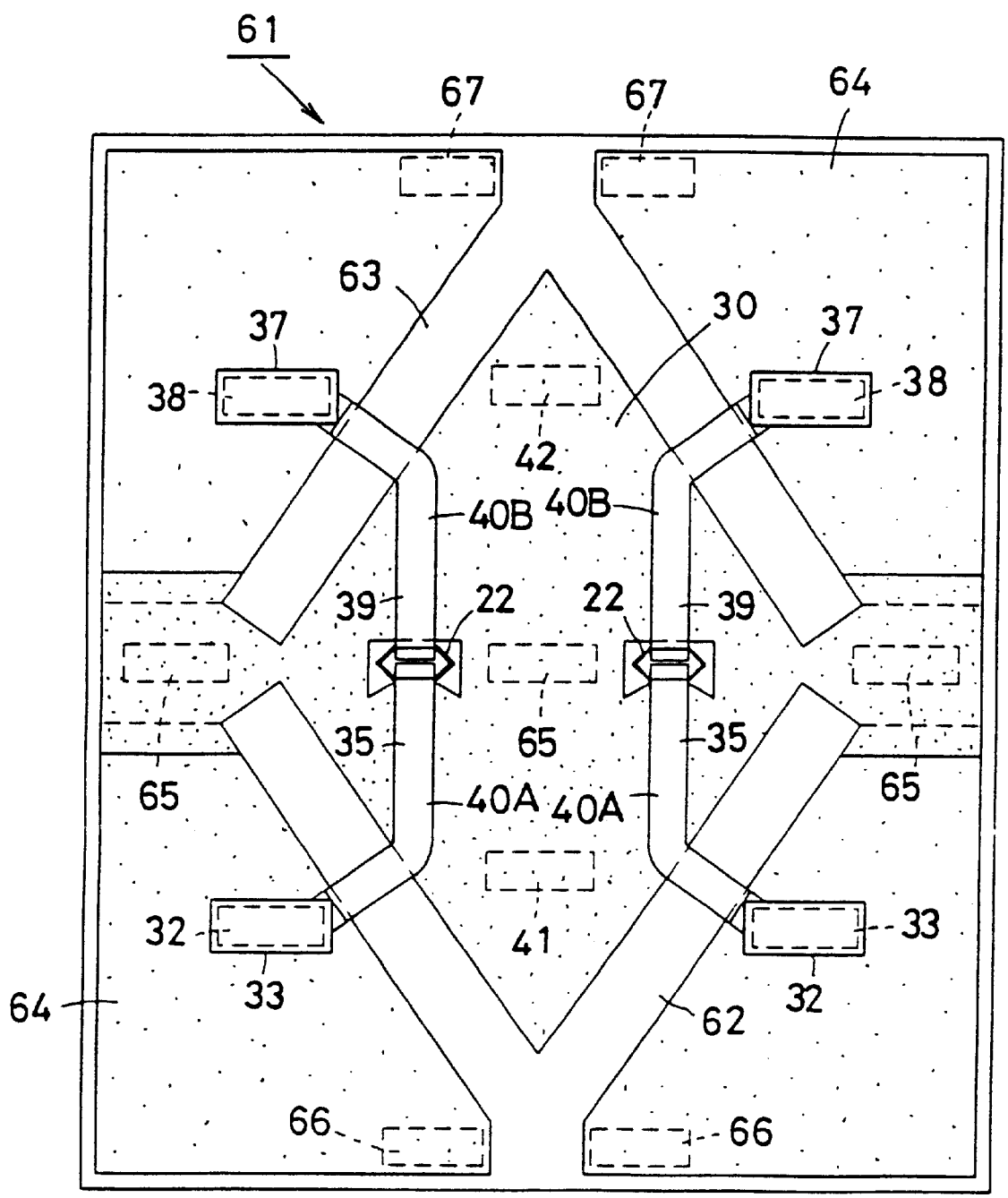
FIG. 9 is a plan view of a high-frequency semiconductor device according to a third embodiment of the present invention.

FIG. 9 is a plan view of a high-frequency semiconductor device 61 according to a third embodiment of the present invention. In this embodiment, two intrinsic device sections 22 are formed with an appropriate distance being left therebetween, and microstriplines 40A and 40B are formed at the input and output sides of each intrinsic device section 22, respectively. A Y-shaped branched input-side slot line 62 is formed between an extending source electrode 30 and a ground electrode 64, and each branched section of the slot line 62 is electromagnetically coupled with a respective input-side microstripline 40A. When they are coupled at a distance of $\lambda/4$ away from a tip of the slot line 62 (where $\lambda$ indicates the wavelength of an electromagnetic wave), the maximum coupling is obtained. In the same way, a Y-shaped branched output-side slot line 63 is formed between the extending source electrode 30 and the ground electrode 64, and each branched section of the slot line 63 is electromagnetically coupled with an output-side microstripline 40B. A via hole 65 is electrically connected to the center section of the extending source electrode 30, via holes 66 are electrically connected to the ground conductor 64 at the input side, and via holes 67 are electrically connected to the ground conductor 64 at the output side.

In this embodiment, an RF signal input to the slot line 62 at the input side is divided in the slot line 62, transfers to the microstriplines 40A, and is input to each intrinsic device section 22. RF signals output from the intrinsic device sections 22 transfer through the microstriplines 40B to the slot line 63, are combined in the slot line 63, and are output from the slot line 63. Therefore, in this embodiment, even larger output power can be obtained than in a semiconductor device having a single intrinsic device section.

Since the gate electrode 36 and the drain electrode 31 are connected to each intrinsic device section 22 with wide wiring patterns, the resistance of each electrode is suppressed to a low level.

Fourth Embodiment

Figure 10:
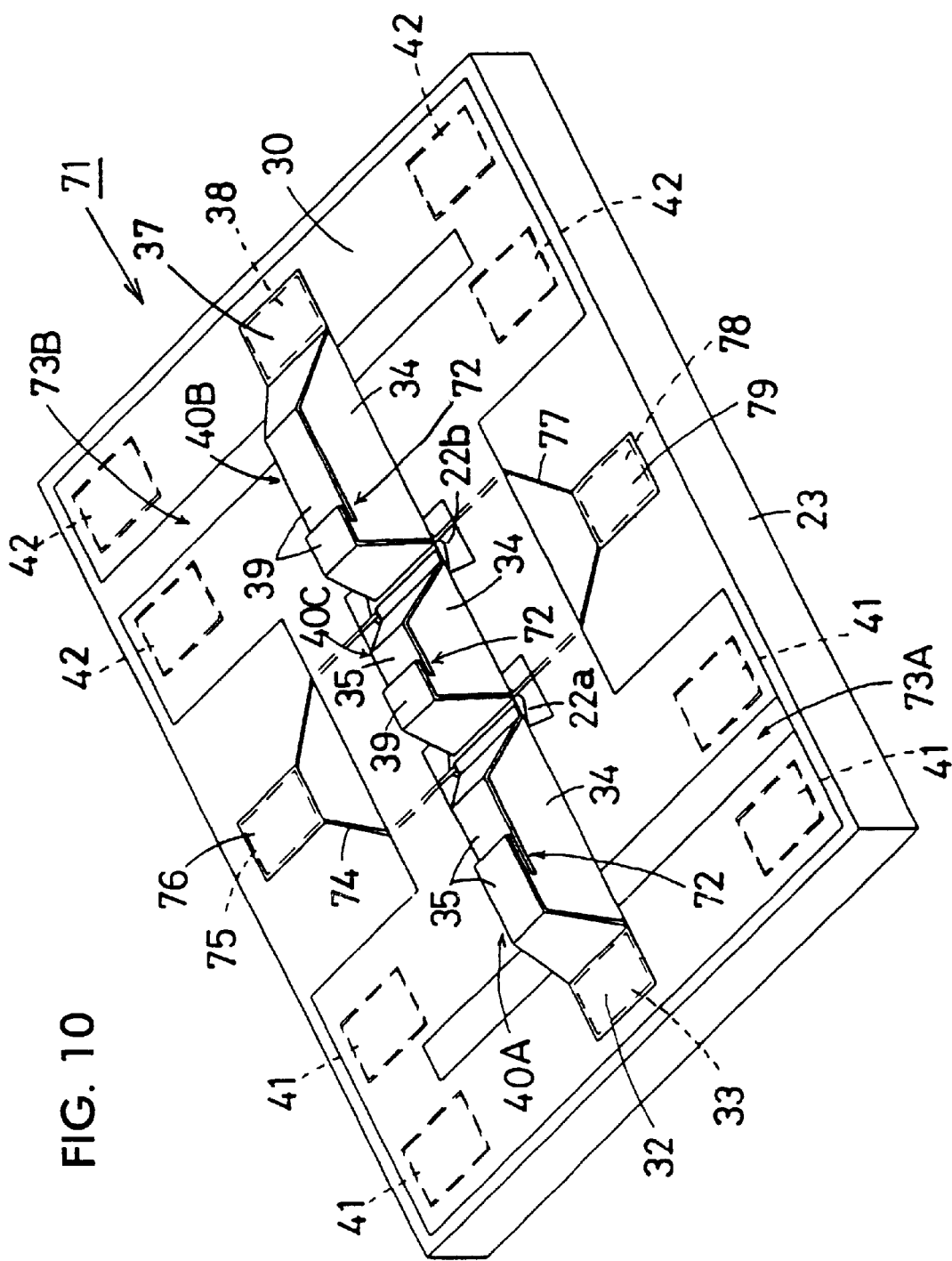
FIG. 10 is a plan view showing a structure of a high-frequency semiconductor device according to a fourth embodiment of the present invention.

FIG. 10 is a plan view of a high-frequency semiconductor device 71 according to a fourth embodiment of the present invention. In this embodiment, a plurality of intrinsic device sections 22a and 22b are connected in series. Since different voltages are applied to the drain electrode 31 of the first-stage intrinsic device section 22a and to the gate electrode 36 of the second-stage intrinsic device section 22b, an extending drain electrode 39 of the first-stage intrinsic device section 22a and an extending gate electrode 35 of the second-stage intrinsic device section 22b are capacitively coupled through a dielectric layer 34 by a direct-current-blocking thin-film opposing capacitor structure 72. Therefore, the first-stage intrinsic device section 22a and the second-stage intrinsic device section 22b are connected with a microstripline 40C having the thin-film capacitor structure 72.

The same thin-film capacitor structure 72 is also formed in an extending gate electrode 35 of the first-stage intrinsic device section 22a, so the gate pad section 32 and the first intrinsic device section 22a are connected with a microstripline 40A having the thin-film capacitor structure 72.

The same thin-film capacitor structure 72 is also formed in an extending drain electrode 39 of the second-stage intrinsic device section 22b, so the second-stage intrinsic device section 22b and the drain pad section 37 are connected with a microstripline 40B having the thin-film capacitor structure 72.

At the input and output sections of the semiconductor device 71, slot lines 73A and 73B are formed at locations where the extending source electrode 30 is not formed. The input-side slot line 73A is electromagnetically coupled with the input-side microstripline 40A, and the output-side slot line 73B is electromagnetically coupled with the output-side microstripline 40B.

A gate bias line 74 used for applying a DC bias to the gate electrode 36 extends from a pad 76 provided on a via hole 75 at a location where the extending source electrode 30 is not formed, to the gate electrode 36. In the same way, a drain bias line 77 used for applying a DC bias to the drain electrode 31 extends from a pad 79 provided on a via hole 78 at a location where the extending source electrode 30 is not formed, to the drain electrode 31. The gate bias line 74 and the drain bias line 77 pass under a buffer layer 24 below the lower surface of the extending source electrode 30, and are insulated from the extending source electrode 30. They may be insulated from the extending source electrode 30 by additionally placing one insulating layer under the extending source electrode 30.

In the microstripline 40C, which connects the two intrinsic device sections 22a and 22b, the line width and the line length $(=\lambda/4)$ thereof are selected such that the conditions for a $\lambda/4$ transformer which achieves impedance matching with both intrinsic device sections 22a and 22b are satisfied.

According to the semiconductor device 71 having such a structure, a large power gain is obtained and the operating frequency can be increased. FIG. 11 is a chart showing the gain-frequency characteristics (indicated by a solid line) of a semiconductor device having a single-stage intrinsic device section 22 and the gain-frequency characteristics (indicated by a dotted line) of a semiconductor device having two-stage intrinsic device sections 22a and 22b. As shown in FIG. 11, whereas a usual millimeter-wave device has a power gain of about 6 dB in the 60 GHz band, a two-stage device has a power gain of about 12 dB in the 60 GHz band and obtains a power gain of 6 dB even near 90 GHz.

In the above embodiments, microstriplines, striplines, and coplanar lines are used as the input and output micro-wave transmission lines. Other lines may be used if they form a waveguide, such as an H line in which dielectric film is placed between the gate and source electrodes and between the drain and source electrodes.

What is claimed is:

1. A high-frequency semiconductor device, comprising:
   at least one intrinsic device section disposed on a semiconductor substrate;
   a source electrode and a drain electrode disposed in said intrinsic device section with a gate electrode therebetween;
   a first micro-wave transmission line, said first transmission line being formed by a first electrode connected to said gate electrode, a second electrode connected to said source electrode and a first dielectric layer therebetween, said first dielectric layer having a dielectric constant greater than one and being disposed on said second electrode, said first electrode being disposed on said first dielectric layer;

a second micro-wave transmission line, said second transmission line being formed by a third electrode connected to said drain electrode, a fourth electrode connected to said source electrode, and a second dielectric layer therebetween, said second dielectric layer having a dielectric constant greater than one and being disposed on said fourth electrode, said third electrode being disposed on said second dielectric layer; and both of the transmission lines being directly connected with said intrinsic device section.

2. A high-frequency semiconductor device according to claim 1, wherein said first electrode is connected directly to said gate electrode and said second electrode is connected directly to said source electrode, and said third electrode connected directly to said drain and said fourth electrode is connected directly to said source electrodes.

3. A high-frequency semiconductor device according to claim 1, wherein said at least one intrinsic device section comprises a plurality of said intrinsic device sections disposed on said semiconductor substrate and wherein said plurality of intrinsic device sections are connected to each other by further micro-wave transmission lines.

4. A high-frequency semiconductor device according to claim 3, said further microwave transmission line comprising:
- a dielectric layer on said source electrode;
- a fifth electrode disposed on said dielectric layer, said fifth electrode being connected to one of said plurality of intrinsic device sections;
- a sixth electrode disposed on said dielectric layer, said sixth electrode being connected to another one of said plurality of intrinsic device sections;
- wherein a part of said fifth electrode and part of said sixth electrode being overlapped with each other through another dielectric layer.

5. A high-frequency semiconductor device according to claim 1 further comprising:
- a coplanar line electromagnetically coupled to at least one of said first and second microwave transmission lines.

6. A high-frequency semiconductor device according to claim 1 further comprising:
- a slot line electromagnetically coupled to at least one of said first and second microwave transmission lines.

7. A high-frequency semiconductor device according to claim 6, wherein said microwave transmission line being coupled to said slot line at a distance of $\lambda/4$ away from a tip of the slot line where $\lambda$ is a wavelength of electromagnetic wave applied to the high-frequency semiconductor device.

8. A high-frequency semiconductor device according to claim 1 further comprising:
- a through hole in said substrate connected to at least one portion of at least one of said first and second microwave lines.

9. A high-frequency semiconductor device according to claim 1, wherein the dielectric constant of respective said dielectric layers being from 2.5 to 5.0.

10. A high-frequency semiconductor device according to claim 1, wherein cross-sectional shape of said dielectric layers along with their extension directions, being tapered off to the respective drain and gate electrodes.

11. A high-frequency semiconductor device according to claim 1, wherein said first and third electrodes being apart from each other through air.

12. A high-frequency semiconductor device, comprising:
- at least one intrinsic device section disposed on a semiconductor substrate;
- a source electrode and a drain electrode disposed in said intrinsic device section with a gate electrode therebetween;
- said source electrode covers the major portion of said semiconductor substrate;
- a first micro-wave transmission line is formed by said gate electrode, said source electrode, and a first dielectric layer therebetween, said first dielectric layer having a dielectric constant greater than one and being disposed on said source electrode, said gate electrode being disposed on said first dielectric layer;
- a second micro-wave transmission line is formed by said drain electrode, said source electrode, and a second dielectric layer therebetween, said second dielectric layer having a dielectric constant greater than one and being disposed on said source electrode, said drain electrode being disposed on said second dielectric layer; and
- both of the transmission lines being directly connected with said intrinsic device section.

13. A high-frequency semiconductor device according to claim 12, wherein said at least one intrinsic device section comprises a plurality of said intrinsic device sections disposed on said semiconductor substrate and wherein said plurality of intrinsic device sections are connected to each other by further micro-wave transmission lines.

14. A high-frequency semiconductor device, comprising:
- at least one intrinsic device section disposed on a semiconductor substrate;
- a source electrode and a drain electrode disposed in said intrinsic device section with a gate electrode therebetween;
- said source electrode covering a major portion of said semiconductor substrate;
- a first microwave transmission line formed by an electrode section conductively connected to said gate electrode, said source electrode, and a first dielectric layer therebetween, said first dielectric layer having a dielectric constant greater than one and being disposed on said source electrode, said electrode section connected to said gate electrode being disposed on said first dielectric layer;
- a second microwave transmission line formed by an electrode section conductively connected to said drain electrode, said source electrode, and a second dielectric layer therebetween, said second dielectric layer having a dielectric constant greater than one and being disposed on said source electrode, said electrode section connected to said drain electrode being disposed on said second dielectric layer; and
- both of the transmission lines being directly connected with said intrinsic device section.

15. A high-frequency semiconductor device according to claim 14, wherein said at least one intrinsic device section comprises a plurality of said intrinsic device sections disposed on said semiconductor substrate and wherein said plurality of intrinsic device sections are connected to each other by further micro-wave transmission lines.

16. A high-frequency semiconductor device, comprising:
- at least two intrinsic device sections disposed on a semiconductor substrate, each of said intrinsic device sections having;
- a source electrode and a drain electrode disposed in said intrinsic device section with a gate electrode therebetween;

wherein a first microwave-transmission line electrically being connected to said gate electrode and being electrically connected to said source electrode, said first transmission line being formed by an electrode connected to said gate electrode, an electrode connected to said source electrode, and a first dielectric layer therebetween, said first dielectric layer having a dielectric constant greater than one, and wherein a second microwave transmission line being electrically connected to said drain electrode and being electrically connected to said source electrode, said second transmission line being formed by an electrode connected to said drain electrode, an electrode connected to said source electrode, and a second dielectric layer therebetween, said second dielectric layer having a dielectric constant greater than one;

a first pair of slot lines, each of said first pair of slot lines being electromagnetically coupled to said respective first microwave transmission lines;

a second pair of slot lines, each of said second pair of slot lines being electromagnetically coupled to said respective second microwave transmission lines;

a third slot line electromagnetically coupled to said first pair of slot lines;

a fourth slot line electromagnetically coupled to said second pair of slot lines; and both of the transmission lines being directly connected with said intrinsic device section.

17. A high-frequency semiconductor device, comprising:

at least one intrinsic device section disposed on a semiconductor substrate;

a source electrode and a drain electrode disposed in said intrinsic device section with a gate electrode therebetween;

a first micro-wave transmission line, said first transmission line being formed by a first electrode connected to said gate electrode a second electrode, connected to said source electrode and a first dielectric layer therebetween, said first dielectric layer having a dielectric constant greater than one and being disposed on said second electrode said first electrode, being disposed on said first dielectric layer; and a second micro-wave transmission line, said second transmission line being formed by a third electrode connected to said drain electrode, a fourth electrode connected to said source electrode, and a second dielectric layer therebetween, said second dielectric layer having a dielectric constant greater than one and being disposed on said fourth electrode, said third electrode being disposed on said second dielectric layer, wherein the width of the respective dielectric layers are substantially same as the width of the electrodes on the respective dielectric layers.

18. A high-frequency semiconductor device, comprising:

at least one intrinsic device section disposed on a semiconductor substrate;

a source electrode and a drain electrode disposed in said intrinsic device section with a gate electrode therebetween;

a first micro-wave transmission line, said first transmission line being formed by a first electrode connected to said gate electrode, a second electrode connected to said source electrode and a first dielectric layer therebetween, said first dielectric layer having a dielectric constant greater than one and being disposed on said second electrode, said first electrode being disposed on said first dielectric layer; and a second micro-wave transmission line, said second transmission line being formed by a third electrode connected to said drain electrode, a fourth electrode connected to said source electrode, and a second dielectric layer therebetween, said second dielectric layer having a dielectric constant greater than one and being disposed on said fourth electrode, said third electrode being disposed on said second dielectric layer, wherein side surfaces of said respective dielectric layers being substantially perpendicular to the major surface of said substrate.

* * * * *